(12) United States Patent        (10) Patent No.:     US 6,549,072 B1
Vernon                           (45) Date of Patent:      Apr. 15, 2003

(54) OPERATIONAL AMPLIFIER HAVING IMPROVED INPUT OFFSET PERFORMANCE

(75) Inventor: Scott D. Vernon, Chandler, AZ (US)

(73) Assignee: Medtronic, Inc., Minneapolis, MN (US)

( * ) Notice: Subject to any disclaimer, the term of this patent is extended or adjusted under 35 U.S.C. 154(b) by 0 days.

(21) Appl. No.: 10/052,035

(22) Filed: Jan. 16, 2002

(51) Int. Cl.[7] ................................................. H03F 3/45
(52) U.S. Cl. ...................... 330/252; 330/257; 330/292; 327/307; 381/120; 323/315
(58) Field of Search ................................ 330/257, 252, 330/292; 327/307; 381/120; 323/315, 316

(56) References Cited

U.S. PATENT DOCUMENTS

| | | | |
|---|---|---|---|
| 4,095,164 A | * 6/1978 | Ahmed | 323/8 |
| 4,223,276 A | * 9/1980 | Nagano | 330/257 |
| 4,418,290 A | * 11/1983 | Nagano | 307/355 |
| 5,166,636 A | 11/1992 | Bien | 330/255 |

OTHER PUBLICATIONS

"Balance of the Bipolar Differential Amplifier: Input Offset Voltage," Soclof, Sidney, *Design and Applications of Analog Integrated Circuits*, Sce. 4.1.5, p. 229.

* cited by examiner

*Primary Examiner*—Henry Choe
(74) *Attorney, Agent, or Firm*—Girma Wolde-Michael; Michael C. Soldner

(57) ABSTRACT

A low-power operational amplifier comprises a differential input-stage and an output stage. The differential input-stage includes first and second differentially coupled input transistors each having base, emitter, and collector electrodes. A first current mirror circuit is coupled to the first and second input transistors and produces a first current which perturbs the current flowing through the first input transistor. The output stage is coupled to the differential input-stage and to the current mirror circuit and produces a second larger current which perturbs the current flowing through the second input transistor. The ratio of the emitter areas of the first and second input transistors are selected to substantially eliminate offset voltage caused by the difference between the first and second perturbing currents. This device is especially suited for low-power Class A bipolar operational amplifiers such as the type employed in low-power medical devices.

20 Claims, 2 Drawing Sheets

OPERATIONAL AMPLIFIER HAVING IMPROVED INPUT OFFSET PERFORMANCE

FIELD OF THE INVENTION

This invention relates generally to operational amplifiers, and more particularly to a low-power Class A bipolar operational amplifiers utilizing unbalanced device sizes to compensate for input-stage offset voltages and suitable for use in low-power medical devices such as hearing aids and the like.

BACKGROUND OF THE INVENTION

Typically, a Class A operational amplifier includes a balanced input circuit comprised of first and second differential input transistors that receive inverting and non-inverting inputs at their respective base electrodes. The input-stage provides an output signal at the collector of the second input transistor. Associated with the first and second input transistors are first and second load transistors, the base electrodes of which are coupled to the collector of the first input transistor. The emitter electrodes of the input transistors are coupled to a source of supply voltage (e.g. ground) via a first current source ($I_{b1}$).

The output of the input-stage is applied to an output stage that in turn has an output terminal for coupling to a load. The output stage must be capable of sinking relatively large currents associated with the load and therefore generally includes a relatively large current source ($I_{b2}$).

To be suitable for use in certain medical devices such as hearing aids, wristwatch-type pulse monitors, implantable medical devices, and the like, an operational amplifier must be capable of operating at low-power with low supply voltages (e.g. 1.5 volts). Thus, it is desired that $I_{b1}$ be relatively small, in particular less than $Ib_2$, which in turn must be large enough to drive the load. Unfortunately, this difference creates non-random base current imbalances which in turn cause the currents in the collectors of the first and second input transistors to be perturbed to different degrees creating an undesirable input offset voltage.

In the past, the problem of input offset voltage in bipolar operational amplifiers has been addressed in several ways. For example, an emitter follower may be used as a buffer between the input and output stages. Alternatively, a higher current may be utilized in the front-end differential pair, and yet another known approach involves the use of base current cancellation techniques. Unfortunately, these solutions are not completely compatible with low-power designs.

In view of the foregoing, it should be appreciated that it would be desirable to provide a lower power bipolar operational amplifier which exhibits substantially reduced input offset voltages for use in low-power medical devices. Additional desirable features will become apparent to one skilled in the art from the foregoing background of the invention and following detailed description of a preferred exemplary embodiment and appended claims.

SUMMARY OF THE INVENTION

In accordance with an aspect of the present invention, there is provided a low-power operational amplifier comprising a differential input-stage and an output stage. The differential input-stage includes first and second differentially coupled input transistors each having base, emitter, and collector terminals. A first current mirror circuit is coupled to the first and second input transistors and produces a first current which perturbs the current flowing through the first input transistor. The output stage is coupled to the differential input-stage and to the current mirror circuit and produces a second larger current which perturbs the current flowing through the second input transistor. The ratio of the emitter areas of the first and second input transistors are selected to substantially eliminate offset voltage caused by the difference between the first and second perturbing currents.

BRIEF DESCRIPTION OF THE DRAWINGS

The following drawings are illustrative of particular embodiments and therefore do not limit the scope of the invention, but are presented to assist in providing a proper understanding of the invention. The drawings are not to scale (unless so stated) and are intended for use in conjunction with the explanations in the following detailed description. The present invention will hereinafter be described in conjunction with the accompanying drawings, wherein like referenced numerals denote like elements, and.

DESCRIPTION OF THE PREFERRED EXEMPLARY EMBODIMENTS

Figure 1:
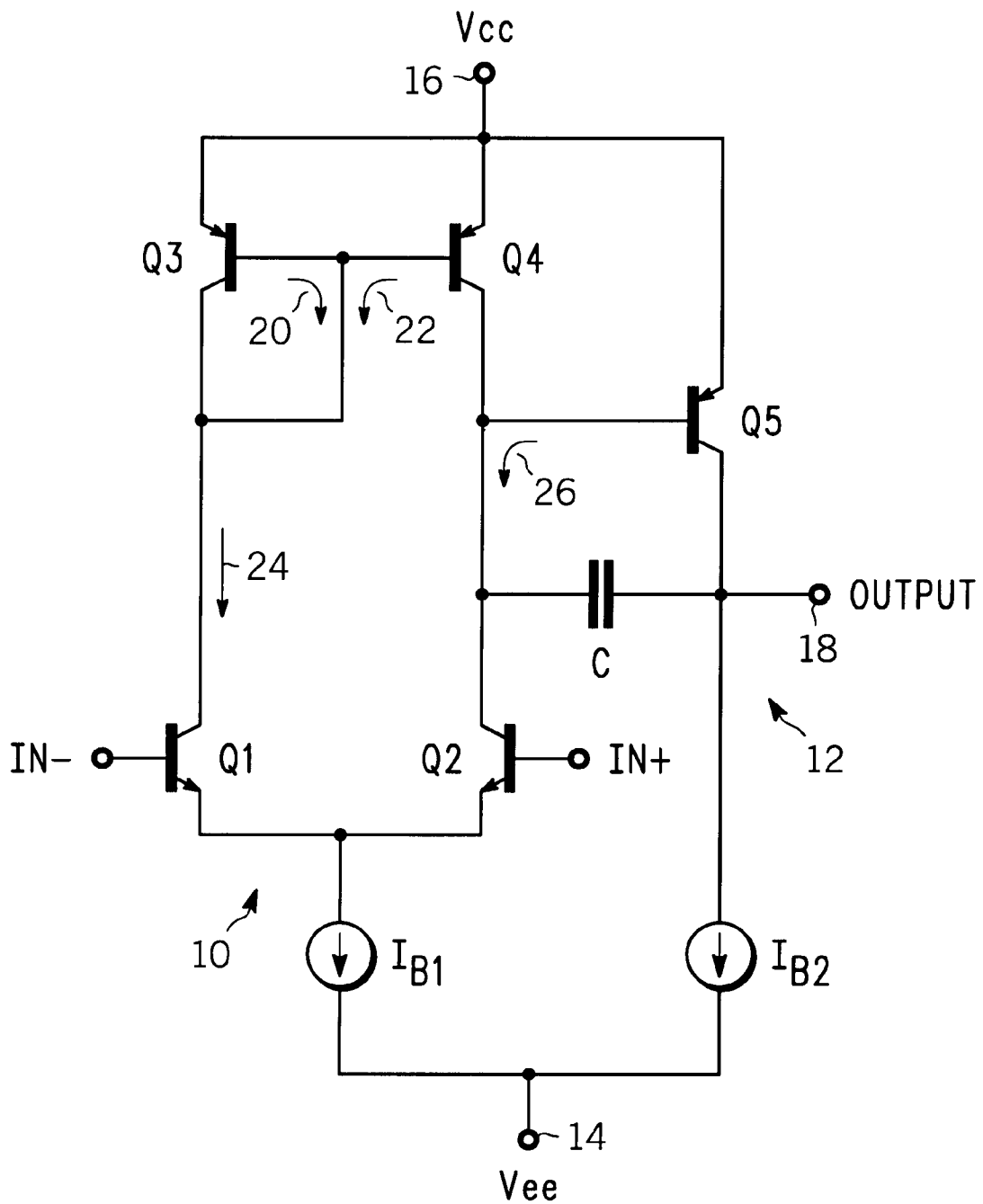
FIG. 1 is a schematic diagram of an operational amplifier in accordance with the first embodiment of the present invention.

FIG. 1 is a schematic diagram of a basic operational amplifier comprising an input-stage 10 and an output stage 12. Input-stage 10 includes first and second differentially coupled NPN transistors $Q_1$ and $Q_2$, first and second PNP load transistors $Q_3$ and $Q_4$, and current source $I_{B1}$. The base of transistor $Q_1$ is coupled to an inverting input IN−, and the base of transistor $Q_2$ is coupled to a non-inverting input terminal IN+ in the well-known manner. Current source $I_{B1}$ is coupled to the emitters of transistors of $Q_1$ and $Q_2$ and to a first supply voltage terminal 14 which maybe coupled to a source of supply voltage $V_{ee}$ (e.g. ground). Load transistors $Q_3$ and $Q_4$ are coupled in a current mirror configuration between the collectors of input transistors $Q_1$ and $Q_2$ and a second supply voltage terminal 16 which may be coupled to a second supply voltage $V_{cc}$ (e.g. 1 volts–1.5 volts).

Output stage 12 comprises PNP transistor $Q_5$, compensation capacitor C, and a second current source $I_{B2}$. Output transistor $Q_5$ has a base coupled to the collectors of transistors $Q_2$ and $Q_4$, an emitter coupled to supply voltage terminal 16, and a collector coupled to output terminal 18. Compensation capacitor C is coupled between the collector of transistor $Q_5$ and the collectors of transistors $Q_2$ and $Q_4$. Finally, current source $I_{B2}$ is coupled between the collector of transistor $Q_5$ and supply voltage terminal 14.

The operational amplifier shown in FIG. 1 operates in the well-known manner. That is, if input signal IN+ is greater than input signal IN−, the current flowing through the collector of transistor $Q_2$ is greater than that flowing through the collector of transistor $Q_1$. Since $Q_1$'s collector current is mirrored at the collector of transistor $Q_4$, the voltage at the base of transistor $Q_5$ will fall causing transistor $Q_5$ to turn on thus raising the voltage at output terminal 18. If, on the other hand, input voltage IN+ is less than input voltage IN−, the current flowing in the collector of transistor $Q_1$ will be greater than that flowing in the collector of transistor $Q_2$. Since the current flowing in the collector of transistor $Q_1$ is mirrored at collector at transistor $Q_4$, the voltage at the base of transistor $Q_5$ will rise causing transistor $Q_5$ to turn off. In this case, current source $I_{B2}$ will sink current from output terminal 18 causing the voltage at output terminal 18 to fall.

The operational amplifier shown in FIG. 1 amplifies the difference between the signals at inverting input IN− and non-inverting input IN+. The amplified signal is produced at the collector of transistor $Q_4$ which in turn drives output transistor $Q_5$ causing current to be either supplied to or sourced from output terminal 18 in the well known manner. When input IN− is substantially equal to input IN+, the current flowing through transistor $Q_1$ (i.e. $I_{Q1}$) is substantially equal to the current flowing through transistor $Q_2$ (i.e. $I_{Q2}$) and very little input offset voltage results. That is, $I_{Q1}=I_{Q2}=I_{B1}/2$. If the current flowing through transistors $Q_1$ and $Q_2$ is different when IN− equals IN+, an undesirable input voltage is produced.

The base current of load transistor $Q_3$ (i.e. $I_{Q3b}/2\beta$ where $\beta$ is the current gain) and the base current of load transistor $Q_4$ (i.e. $I_{Q4b}/2\beta$) indicated by arrows 20 and 22 respectively combine to form a current $I_{B1}/\beta$ indicated by arrow 24 which impacts or perturbs the collector current of transistor $Q_1$ (i.e. $I_{Q1c}$). The base current of output transistor $Q_5$ (i.e. $I_{B2}/\beta$) indicated by arrow 26 impacts or perturbs the collector current of transistor $Q_2$ (i.e. $I_{Q2c}$). If these perturbing currents are substantially equal (i.e. $I_{B1}/=I_{B2}/\beta$), no significant offset voltage results. That is, $I_{B1}$ should be substantially equal to $I_{B2}$ to avoid the production of unwanted input offset voltage.

Current source $I_{B2}$ must have sufficient capacity to accommodate high currents produced by low resistance loads coupled to output terminal 18. In contrast, low-power/low-voltage operational amplifier designs (i.e. those for when the voltage difference between $V_{ee}$ and $V_{cc}$ is approximately 1 volt to 1.5 volts) suitable for use in medical devices such as hearing aids require a relatively small $I_{B1}$; (i.e. substantially less than $I_{B2}$). In this case, the sum of the base currents of transistors $Q_3$ and $Q_4$ (i.e. $I_{Q3b}$ and $I_{Q4b}$ respectively) will be substantially less than the base current of transistor $Q_5$ (i.e. $I_{Q5b}$). Now, more current flows through transistor $Q_2$, and current $I_{B1}$ is no longer split equally between transistors $Q_1$ and $Q_2$ resulting in an offset voltage.

The question therefore arises as to how to substantially reduce offset when $IQ_1$ is less than $I_{Q2}$. The answer resides in the recognition that while the perturbing base current of transistor $Q_5$ ($I_{Q5b}$) is substantially greater than the sum of the perturbing base currents of transistors $Q_3$ and $Q_4$ ($I_{Q3b}$ and $I_{Q4b}$), these currents can be made to impact the collector currents of input transistors $Q_2$ and $Q_1$ respectively by substantially the same percentage. That is, $I_{Q5b}$ can have substantially the same percentage impact on the collector current in transistor $Q_2$ (i.e. $I_{Q2c}$) as does the sum of $I_{Q3b}$ and $I_{Q4b}$ has on the collector current of transistor $Q_1$ (i.e. $I_{Q1c}$). Thus, the ratio of $I_{Q1c}$ to the sum of $I_{Q3b}$ and $I_{Q4b}$ can be made to be substantially equal to the ratio of $I_{Q2c}$ to $I_{Q5b}$ as shown in equation (1) below:

$$\frac{I_{Q1c}}{I_{Q3b}+I_{Q4b}} = \frac{I_{Q2c}}{I_{Q5b}} \qquad (1)$$

This can be accomplished by adjusting the emitter areas of $Q_1$ and $Q_2$. If transistor $Q_1$ is assumed to have an emitter area $A_1$, and transistor $Q_2$ is assumed to have an emitter area $A_2$, and assuming total emitter area $A=A_1+A_2$, then:

$$I_{Q1c}=I_{B1}(A_1/A)$$

and $$I_{Q2c}=I_{B1}(A_2/A)$$

It was determined above that:

$$I_{Q3b}+I_{Q4b}=I_{B1}/\beta$$

and $$I_{Q5b}=I_{B2}/\beta$$

Substituting terms yields:

$$\frac{I_{B1}(A_1/A)}{I_{B1}/\beta} = \frac{I_{B2}(A_2/A)}{I_{B2}/\beta} \text{ or}$$

$$A_1/A_2 = I_{B1}/I_{B2}$$

It should be noted that if transistor $Q_3$ is assumed to have an emitter area $A_3$ and transistor $Q_4$ is assumed to have an emitter area $A_4$, then the values of $A_3$ and $A_4$ are driven by the values of $A_1$ and $A_2$ such that:

$$A_1/A_2=A_3/A_4=I_{B1}/I_{B2} \qquad (2)$$

Thus, by adjusting the emitter areas of transistors $Q_1$, $Q_2$, $Q_3$, and $Q_4$ in accordance with Equation 2, a low-power, low-voltage, low-offset, bipolar operational amplifier is achievable.

Figure 2:
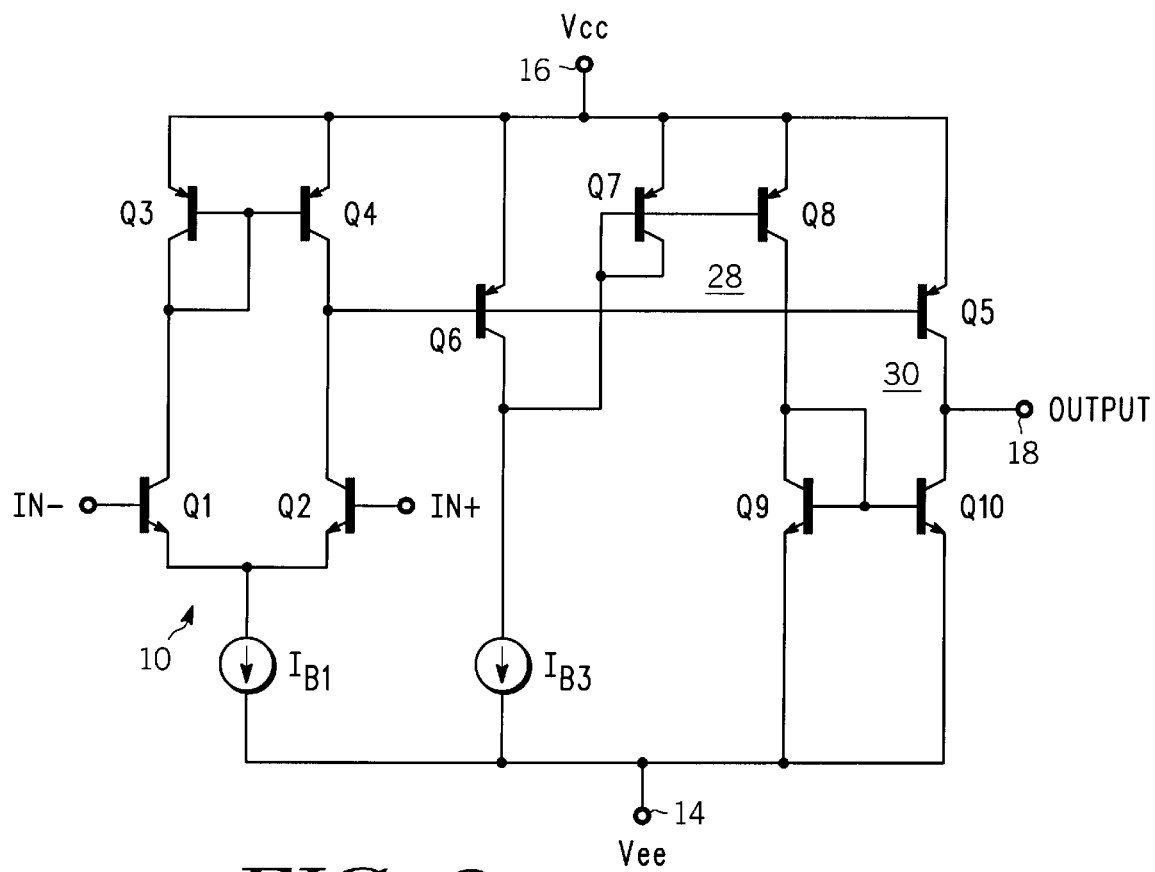
FIG. 2 is a schematic diagram of an operational amplifier in accordance with second embodiment of the present invention.

FIG. 2 is a schematic diagram of a second embodiment of the present invention wherein like reference numerals denote like elements. The circuit is substantially similar except that constant current source $I_{B2}$ is replaced with a variable current source comprised of a PNP transistor $Q_6$ and current source $I_{B3}$, a second current mirror 28 comprised of PNP transistors $Q_7$ and $Q_8$, and a third current mirror 30 comprised of NPN transistors $Q_9$ and $Q_{10}$. As can be seen, current source $I_{B3}$ is coupled in series with the collector-emitter path of transistor $Q_6$, the series combination being coupled between supply voltage terminals 14 and 16. The base of transistor $Q_6$ is coupled to the collectors of transistors $Q_2$ and $Q_4$ as is the base of transistor $Q_5$. The input of current mirror 28 (i.e. the base/collector of transistor $Q_7$) is coupled to the collector of transistor $Q_6$, and the output of current mirror 28 (i.e. the collector of transistor $Q_8$) is coupled to the input of the current mirror 30 (i.e. the base/collector of transistor $Q_9$). The output of current mirror 30 (i.e. the collector of transistor $Q_{10}$) is coupled to the collector of transistor $Q_5$ and to output terminal 18.

The operational amplifier shown and described in connection with FIG. 1 does not provide for any control of the output pull-down current. That is, current $I_{B2}$ is dissipated irrespective of whether or not it is necessary to sink current from output terminal 18. The circuit shown in FIG. 2, however, provides for the dynamic control of the output pull-down current; that is, the current through transistor $Q_{10}$ is responsive to the difference between IN− and IN+. The difference between current $I_{B3}$ and the collector current in transistor $Q_6$ (i.e. $I_{Q6c}$) flows through current mirror 28 and is then mirrored in current mirror 30 so as to become a dynamic pull-down current at output terminal 18.

Aside from the above-described differences, the above-described analysis relating to offset voltage reduction applies to the circuit shown in FIG. 2 with the exception that the current $I_{B2}$ in FIG. 1 is replaced with the sum of the collector currents of transistors $Q_5$ and $Q_6$; (i.e. $I_{Q5c}+I_{Q6c}$).

Figure 3:
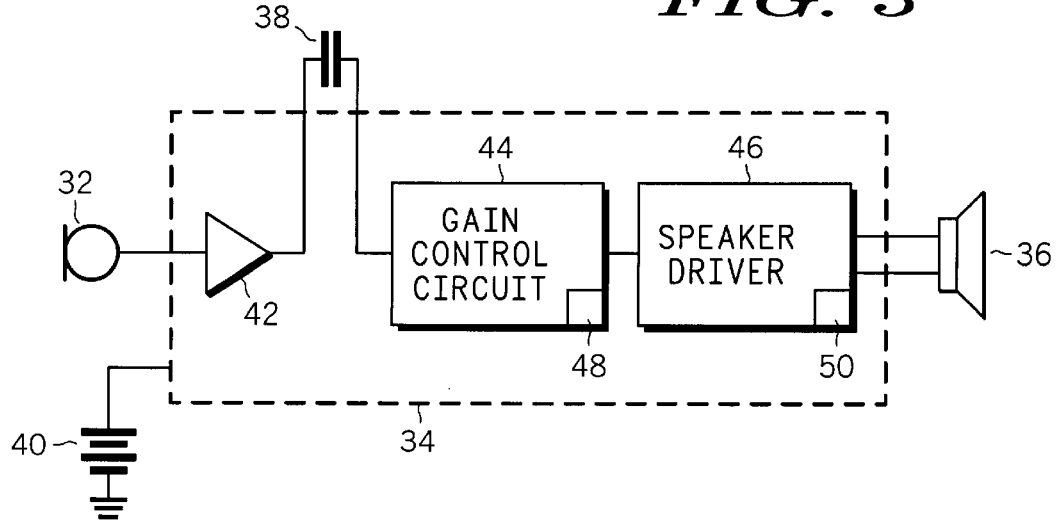
FIG. 3 is a block diagram of a simple hearing aid capable of utilizing the operational amplifiers shown in FIGS. 1 and 2.

FIG. 3 is a block diagram of a simple hearing aid that could benefit by incorporating the inventive low-power operational amplifier. It comprises a microphone 32, an integrated circuit 34, a speaker 36, a capacitor 38, and a battery 40 (typically 1.5 volts). Due to the low voltage of battery 40, the hearing aid should draw as little current as possible. Thus, the components and circuits on integrated circuit 34 should be capable of operating at low current and low voltage. Since the input signal from microphone 32 has low amplitude, the use of bipolar transistors is preferred over high-noise CMOS transistors. Thus, low voltage, low current, bipolar operational amplifiers having reduced offset voltages of the type shown and described in connection with FIGS. 1 and 2 are particularly suitable for use in hearing aids.

Integrated circuit 34 comprises a preamplifier 42 having an input coupled to receive the output of microphone and having an output coupled to a first terminal of capacitor 38, a gain control circuit 44 having an input coupled to a second terminal of capacitor 38. A speaker driver circuit 46 has an input coupled to the output of gain control circuit 44 and an output coupled to drive speaker 36.

Preamplifier 42 has a gain (typically around ten), and its output is coupled to gain control circuit 44 through capacitor 38 to eliminate the effects of any DC offset voltage in preamplifier 42. Gain control circuit 44, however, has a variable gain that could be as high as twenty, and offsets in the gain control operational amplifier 48 are multiplied by this gain. This could cause premature clipping of the audio signals. Thus, it is extremely important that operational amplifier 48 be of the types previously described.

Speaker 36 contains a coil of wire, which represents a high impedance at audio frequencies but is nearly a short circuit at DC. Any offset in the speaker driver operational amplifier 50 could cause excessive current drain from battery 40. Thus, an operational amplifier of the type described above in connection with FIGS. 1 and 2 would be especially suitable for use in speaker driver 46.

Thus, there has been provided a low-power bipolar operational amplifier that exhibits substantially reduced input offset voltage through the proper selection of device emitter areas for use in low-power medical devices such as hearing aids.

While preferred exemplary embodiments have been presented in the foregoing detailed description, it should be appreciated that a vast number of variations in the embodiments exist. It should also be appreciated that the preferred embodiments are only examples and are not intended to limit the scope, applicability, or configuration of the invention in any way. Rather, the foregoing detailed description provides those skilled in the art with a convenient roadmap for implementing the preferred exemplary embodiments of the invention. Various changes may be made in the function and arrangement described in connection with the exemplary preferred embodiments without departing from the spirit and scope of the invention as set forth in the appended claims.

What is claimed is:

1. A low-power operational amplifier, comprising;
   a differential input-stage comprising;
   first and second differentially coupled input transistors each having a base, an emitter, and a collector; and
   a first current mirror circuit coupled to said first and second input transistors, said first current mirror circuit producing a first current which perturbs current flowing through said first input transistor; and
   an output stage coupled to said differential input-stage and to said current mirror circuit, said output stage producing a second current, larger than said first current, which perturbs the current flowing through said second input transistor, the ratio of emitter areas of the first and second input transistors being selected to substantially eliminate offset voltage caused by the difference between said first current and said second larger current.

2. A low-power operational amplifier according to claim 1 wherein said first current perturbs the current flowing in said first input transistor by the same percentage as said second current perturbs the current flowing in said second input transistor.

3. A low-power operational amplifier according to claim 1, wherein said first current mirror circuit comprises:
   a third transistor configured as a diode having a collector coupled to the collector of said first input transistor, an emitter coupled to a first supply voltage terminal, and a base; and
   a fourth transistor having a base coupled to the base of said third transistor, a collector coupled to collector of said second input transistor, and an emitter coupled to said first supply voltage terminal, the ratio of the emitter area of said third transistor to the emitter area of said fourth transistor being substantially equal to the ratio of the emitter area of said first transistor to the emitter area of said second transistor.

4. A low-power operational amplifier according to claim 3 wherein said output stage comprises a fifth transistor having a base coupled to the collectors of said second and fourth transistors, an emitter coupled to said first supply voltage terminal, and a collector coupled to an output terminal of said operational amplifier.

5. A low-power operational amplifier according to claim 4 further comprising:
   a first current source coupled between the emitters of said first and second input transistors and a second supply voltage terminal; and
   a second current source coupled between the collector of said fifth transistor and said second supply voltage terminal, wherein the ratio of the emitter area of said first input transistor to the emitter area of said second input transistor is substantially equal to the ratio of said first current source to said second current source.

6. A low-power operational amplifier according to claim 4 further comprising:
   a first current source coupled between the emitters of said first and second input transistors and a second supply voltage terminal;
   a sixth transistor having a base coupled to the collectors of said second and fourth transistors, an emitter coupled to said first supply voltage terminal, and having a collector;
   a second current source coupled between the collector of said sixth transistor and said second supply voltage terminal;
   a second current mirror circuit coupled to the collector of said sixth transistor; and
   a third current mirror circuit coupled between said second current mirror circuit and the collector of said fifth transistor.

7. A low-power operational amplifier according to claim 6 wherein the ratio of the emitter area of said first input transistor to the emitter area of said second input transistor is substantially equal to the ratio of said first current source to the sum of the currents flowing through the collectors of said fifth and sixth transistors.

8. A low-power operational amplifier according to claim 4 wherein said first and second input transistors are NPN transistors and said third, fourth, and fifth transistors are PNP transistors.

9. A low-power operational amplifier according to claim 8 wherein said first supply voltage terminal is for coupling a first potential substantially equal to 1.5 volts and said second supply voltage terminal is for coupling to a second potential substantially equal to ground.

10. A low-power operational amplifier, comprising:
 a differential input-stage comprising;
  first and second differentially coupled input transistors each having a base, an emitter, and a collector; and
  a first current source coupled in series with the emitter-collector path of said first and second input transistors for generating a first current; and
 an output stage coupled to said input-stage, said output stage comprising;
  a first output transistor having a base, an emitter, and a collector; and
  a second current source for generating a second current larger than said first current and coupled in series with the emitter-collector path of said first output transistor, the ratio of the emitter area of said first input transistor to the emitter area of said second input transistor being selected to substantially eliminate offset caused by the difference between said first and said second currents.

11. A low-power operational amplifier according to claim 10 wherein the ratio of the emitter area of said first input transistor to the emitter area of said second input transistor is substantially equal to the ratio of said second current source to said first current source.

12. A low-power operational amplifier according to claim 10 wherein said second current perturbs the current flowing in said first input transistor by the same percentage as said first current perturbs the current flowing in said second input transistor.

13. A low-power operational amplifier according to claim 11 wherein said first current mirror circuit comprises:
 a third transistor configured as a diode having a collector coupled to the collector of said first input transistor, an emitter coupled to a first supply voltage terminal, and having a base; and
 a fourth transistor having a base coupled to the base of said third transistor, a collector coupled to the collector of said second input transistor, and an emitter coupled to said first supply voltage terminal, the ratio of the emitter area of said third transistor to the emitter area of said fourth transistor being substantially equal to the ratio of the emitter area of said first input transistor to the emitter area of said second input transistor.

14. A low-power operational amplifier according to claim 12 wherein said first and second input transistors are NPN transistors and said third, fourth, and fifth transistors are PNP transistors.

15. A low-power operational amplifier according to claim 14 wherein said first supply voltage terminal is for coupling to a first potential substantially equal to 1.5 volts and said second supply voltage terminal is for coupling to a second potential substantially equal to ground.

16. A low-power operational amplifier, comprising:
 a first current source coupled to a first power supply terminal for generating a first current;
 a differential input-stage coupled between said first current source and a second power supply terminal, said differential input-stage comprising a first output and first and second input transistors each having a base, an emitter, and a collector, the emitter of said first input transistor having a first area and the emitter of said second input transistor having a second area; and
 an output stage coupled to said second power supply terminal and comprising a second output, an input coupled to said first output, and a second current source coupled between said second output and said first power supply terminal, said second current source for generating a second current, larger than said first current, the ratio of said first area to said second area being substantially equal to the ratio of said first current to said second current.

17. A low-power operational amplifier according to claim 16 wherein said first current perturbs current flowing in said second input transistor by the same percentage as said second current perturbs the current flowing in said first input transistor.

18. A low-power operational amplifier according to claim 17 wherein said first power supply terminal is for coupling to a first potential substantially equal to ground and said second power supply terminal is for coupling to a second potential substantially equal to 1.5 volts.

19. A low-power operational amplifier, comprising;
 a first current source coupled to a first power supply terminal for generating a first current;
 a differential input-stage comprising first and second input transistors each having a base, an emitter, and a collector, the emitter of said first input transistor having a first area and the emitter of said second input transistor having a second area, the bases of said first and second input transistors coupled to first and second input terminals respectively;
 first and second load transistors each having a base, an emitter, and a collector, the emitters of said first and second load transistors coupled to a second power supply terminal, the collectors of said first and second load transistors coupled respectively to the collectors of said first and second input transistors, and the bases of said first and second load transistors coupled to each other and to the collectors of said first load transistor and said first input transistor, the base currents of said first and second load transistors having a first effect on the collector current of said first input transistor; and
 an output stage coupled between said first and second power supply terminals and to the collectors of said second input transistor and said second load transistor, said output stage producing a perturbing current having a second effect on the collector current of said second input transistor greater than said first effect, said first and second areas being selected to substantially eliminate input offset voltage.

20. A low-power operational amplifier according to claim 19 wherein said first and second areas are selected such that said first effect and said second effect have substantially the same percent impact on the collector currents of said first and second input transistors respectively.

* * * * *